(12) United States Patent
Chen

(10) Patent No.: US 8,501,622 B2
(45) Date of Patent: Aug. 6, 2013

(54) SEMICONDUCTOR DEVICE WITH TWO OR MORE BOND PAD CONNECTIONS FOR EACH INPUT/OUTPUT CELL AND METHOD OF MANUFACTURE THEREOF

(75) Inventor: Ker-Min Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 626 days.

(21) Appl. No.: 12/748,719

(22) Filed: Mar. 29, 2010

(65) Prior Publication Data
US 2010/0190299 A1 Jul. 29, 2010

Related U.S. Application Data

(60) Division of application No. 11/433,731, filed on May 12, 2006, now Pat. No. 7,714,362, which is a continuation of application No. 10/863,903, filed on Jun. 8, 2004, now Pat. No. 7,071,561.

(51) Int. Cl.
*H01L 21/44* (2006.01)

(52) U.S. Cl.
USPC .............. 438/666; 257/203; 257/E27.11

(58) Field of Classification Search
None
See application file for complete search history.

(56) References Cited

U.S. PATENT DOCUMENTS

| | | | |
|---|---|---|---|
| 4,947,233 A | 8/1990 | Aso | |
| 5,455,460 A | 10/1995 | Hongo et al. | |
| 6,130,484 A | 10/2000 | Kameda et al. | |
| 6,242,814 B1 | 6/2001 | Bassett | |
| 6,380,635 B1 | 4/2002 | Manning et al. | |
| 6,410,990 B2 | 6/2002 | Taylor et al. | |
| 6,717,270 B1 | 4/2004 | Downey et al. | |
| 6,919,632 B2 | 7/2005 | Sei | |
| 6,953,997 B1 | 10/2005 | Merigot et al. | |
| 7,397,138 B2 | 7/2008 | Ohnishi et al. | |
| 2001/0011768 A1 | 8/2001 | Kohara et al. | |
| 2002/0117757 A1* | 8/2002 | Sakamoto et al. | 257/758 |
| 2003/0173672 A1 | 9/2003 | Furuhata | |

* cited by examiner

*Primary Examiner* — Benjamin Sandvik
(74) *Attorney, Agent, or Firm* — Slater & Matsil, L.L.P.

(57) ABSTRACT

A semiconductor device including a plurality of input/output cells and having a first bond pad and at least one second bond pad coupled to each input/output cell. The first bond pads comprise a first pattern, and the at least one second bond pads comprise at least one second pattern, wherein the at least one second pattern is different from or the same as the first pattern. Either the first bond pads, the at least second bond pads, or both, may be used to electrically couple the input/output cells of the semiconductor device to leads of an integrated circuit package or other circuit component.

15 Claims, 4 Drawing Sheets

SEMICONDUCTOR DEVICE WITH TWO OR MORE BOND PAD CONNECTIONS FOR EACH INPUT/OUTPUT CELL AND METHOD OF MANUFACTURE THEREOF

This application is a divisional of U.S. application Ser. No. 11/433,731, filed on May 12, 2006, entitled "Semiconductor Device and Method Thereof With Two or More Bond Pad Connections for Each Input/Output Cell," which is a continuation of U.S. application Ser. No. 10/863,903, filed on Jun. 8, 2004, now U.S. Pat. No. 7,071,561, issued Jul. 4, 2006, entitled "Semiconductor Device and Method Thereof With Two or More Bond Pad Connections for Each Input/Output Cell," which applications are hereby incorporated herein by reference.

TECHNICAL FIELD

The present invention relates generally to semiconductor devices, and more particularly to the formation of bond pads and bond pad connections of integrated circuits.

BACKGROUND

Semiconductor devices are fabricated by forming active devices on or within a semiconductor wafer or work piece. Hundreds or thousands of integrated circuits or die are typically manufactured on a single work piece. Typically, a plurality of insulating, conductive, and semiconductive material layers are sequentially deposited and patterned over the workpiece to form the integrated circuits. One of the uppermost-formed material layers typically comprises a layer for bond pads that make electrical connection to the underlying active areas and components within the workpiece. After the integrated circuits are formed on the workpiece, the semiconductor wafer is then singulated into individual die. In most applications, each individual die is then packaged into an integrated circuit package. Integrated circuit packages may be adapted to contain one individual die, or they may be adapted to contain a plurality of individual die, for example, in the case of multi-chip modules.

A prior art packaged integrated circuit 11 is shown in FIG. 1. The packaged integrated circuit 11 includes a package 13 which may comprise plastic or metal, as examples. A plurality of leads 15 are disposed along the sides of the package 13 as shown, although alternatively, the leads 15 may be disposed on the top or the bottom surfaces of the package 13 (not shown). The leads 15 may be arranged in many different types of configurations, as is well known in the art.

An integrated circuit die 17 or semiconductor device is disposed within the package 13. The semiconductor device 17 has a plurality of bond pads 19 disposed on a surface of the semiconductor device 17. To make electrical connection from the bond pads 19 of the semiconductor device to the leads 15, wiring 21 is typically used. The wiring 21 is often referred to in the art as wire bonds, which may be soldered or spot-welded to a bond pad 19 on a semiconductor device 17 at one end, and routed to and bonded to a lead 15 of the integrated circuit package 13 at the other end. The semiconductor device 17 shown in FIG. 1 includes bond pads 19 disposed on a top surface thereof. Alternatively, the bond pads 19 may be disposed on the bottom surface or other areas of the semiconductor device 17. The bond pads 19 may be arranged in a variety of patterns.

FIGS. 2 and 3 are exemplary of two of the several different types of bond pad patterns used in the semiconductor industry. FIG. 2 shows a top view of a portion of a semiconductor device 100, wherein bond pads 104a and 104b are positioned in a traditional bond pad pattern. The semiconductor device 100 includes a plurality of input/output cells 102a and 102b formed in an upper layer of the semiconductor device 100. The input/output cells 102a and 102b are electrically coupled to active areas within a semiconductor workpiece, not shown. The active areas may reside beneath the input/output cells 102a and 102b, or they may be coupled to the input/output cells 102a and 102b using conductive lines beneath or located to the side of the input/output cells 102a and 102b, for example.

In a traditional bond pad pattern, the bond pads 104a and 104b are staggered and are disposed to the side of the input/output cells 102a and 102b, as shown. The bond pads 104a and 104b are typically coupled to the input/output cells 102a and 102b, respectively, by one or more conductive pins 106a/108a and 106b/108b, respectively. In the prior art semiconductor device 100 shown, there is one bond pad 104a or 104b for each input/output cell 102a and 102b, respectively. Conductive pins 108a and 108b typically are formed in the same interconnect layer as the bond pads 104a and 104b, while conductive pins 106a and 106b may, for example, partially reside in a via layer.

FIG. 3 shows another type of bond pad pattern, referred to in the art as a circuit under pad (CUP) bonding style. In this semiconductor device 120, the bond pads 122a and 122b are disposed directly over an associated input/output cell 102a and 102b, respectively, as shown. Again, one or more conductive pins 124a/126a and 124b/126b may be used to electrically couple each input/output cell 102a and 102b to the bond pads 122a and 122b, respectively.

One problem in the manufacturing and packaging of semiconductor devices is that the semiconductor devices must be selected according to the pattern of the bond pad desired. For example, when designing circuits, a designer must select whether the traditional bond pad style device 100 as shown in FIG. 2 or a CUP bonding pad style device 120 as shown in FIG. 3 will be used in the circuit design. Semiconductor device manufacturers are often required to provide many types of bond style patterns in order to accommodate their customers' needs. This results in increased costs for the semiconductor device manufacturer because of the many different bond pad pattern designs in use in the industry today. Each different bond pad pattern requires a different lithography mask for patterning the bond pads, for example.

Thus, what is needed in the art is a bond pad scheme that gives circuit designers increased choices of bond pad designs, and reduces the number of bond pad patterns that semiconductor device manufacturers are required to manufacture.

SUMMARY OF THE INVENTION

These and other problems are generally solved or circumvented, and technical advantages are generally achieved, by preferred embodiments of the present invention, which provide two or more bond pad patterns for the input/output cells of a semiconductor device. A first bond pad and a second bond pad are coupled to each input/output cell of a semiconductor device. The first bond pads are arranged in a first pattern, such as a traditional bond pad pattern shown in FIG. 2, and the second bond pads are arranged in another, different pattern, such as the CUP pattern shown in FIG. 3. Either the first bond pad, the second bond pad, or both, may be used to electrically connect the semiconductor device to leads of an integrated circuit package or to other components within a circuit.

In accordance with a preferred embodiment of the present invention, a semiconductor device includes a workpiece, a plurality of active areas formed in the workpiece, and a plurality of input/output cells formed over the plurality of active areas. Each input/output cell is electrically coupled to one of the plurality of active areas. A bond pad layer is disposed over the input/output cells. The bond pad layer includes a first bond pad coupled to each input/output cell and at least one second bond pad coupled to each input/output cell. Each first bond pad and each at least one second bond pad are adapted to electrically couple the semiconductor device to a connection external to the semiconductor device.

In accordance with another preferred embodiment of the present invention, an integrated circuit die includes a workpiece, a plurality of input/output cells formed over the workpiece, and a plurality of first bond pads disposed over the input/output cells. Each first bond pad is electrically coupled to one of the underlying input/output cells. The first bond pads comprise a first pattern. A plurality of second bond pads are disposed proximate the input/output cells. Each second bond pad is spaced apart from and is disposed near a side of an input/output cell. Each second bond pad is electrically coupled to one of the input/output cells. The second bond pads comprise a second pattern, wherein the second pattern is different from the first pattern.

In accordance with yet another preferred embodiment of the present invention, a method of manufacturing a semiconductor device includes providing a workpiece, forming active areas over or within the workpiece, and forming a plurality of input/output cells over at least one active area. The method includes coupling a first bond pad and at least one second bond pad to each input/output cell.

Advantages of embodiments of the present invention include giving a circuit designer a choice between two or more bond pad patterns for packaging an integrated circuit or making electrical connection to each input/output cell of a semiconductor device. Both the first bond pad and the second bond pad coupled to an input/output cell may be used for electrical connections, which provides redundancy in the semiconductor device and provides improved reliability in packaging. For example, if a connection to the first bond pad is broken or becomes disconnected, the semiconductor device will still continue to operate because it is electrically connected to the second bond pad. A further advantage of preferred embodiments of the present invention is reducing costs to the semiconductor device manufacturer, by reducing the number of styles of bond pad pattern designs in their integrated circuit packaging portfolio. The number of lithography masks required by semiconductor device manufacturer is reduced in accordance with embodiments of the present invention. Advantageously, no additional lithography masks or material layers are required in the semiconductor device. The first bond pad pattern and the second bond pad pattern are preferably formed within a single layer of the semiconductor device.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a packaged integrated circuit or semiconductor device. The invention may also be applied, however, to other applications of and uses for integrated circuits, for example. The bond pad patterns shown herein are illustrative; embodiments of the present invention are not limited to the bond pad pattern styles shown.

Figure 1:
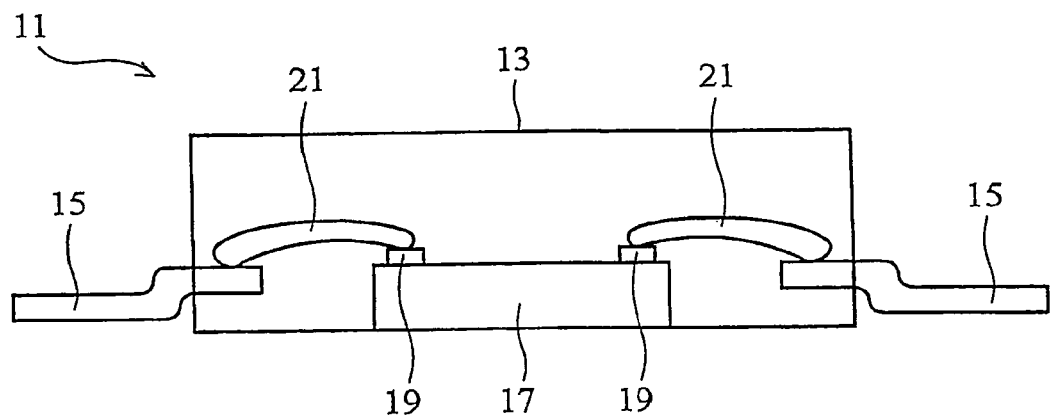
FIG. 1 shows a cross-sectional view of a prior art packaged integrated circuit.
Figure 2:
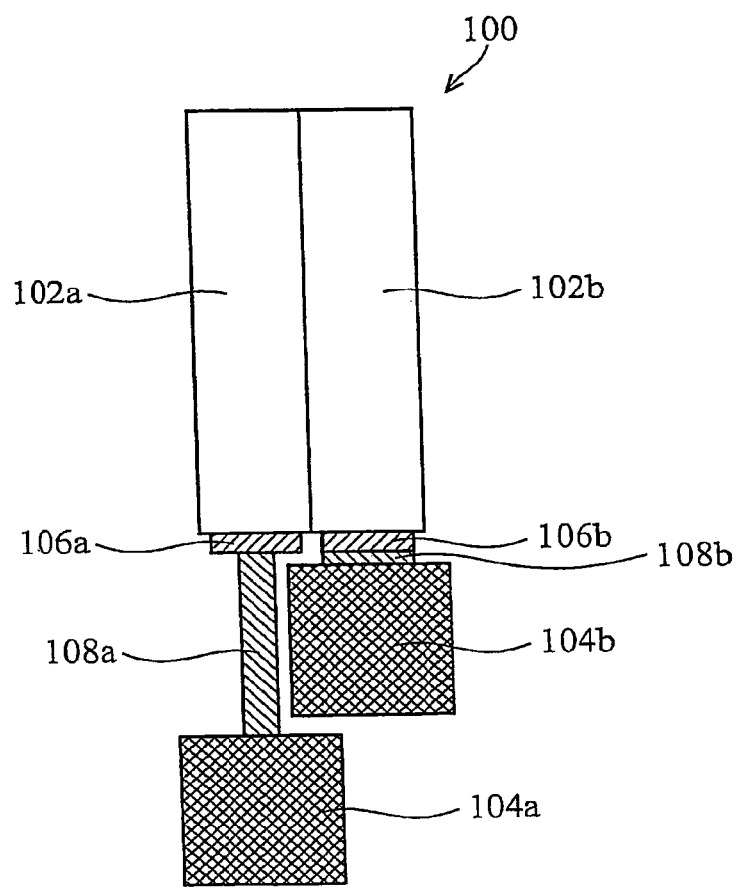
FIG. 2 shows a top view of a portion of a prior art semiconductor device with a traditional bond pad style pattern.
Figure 3:
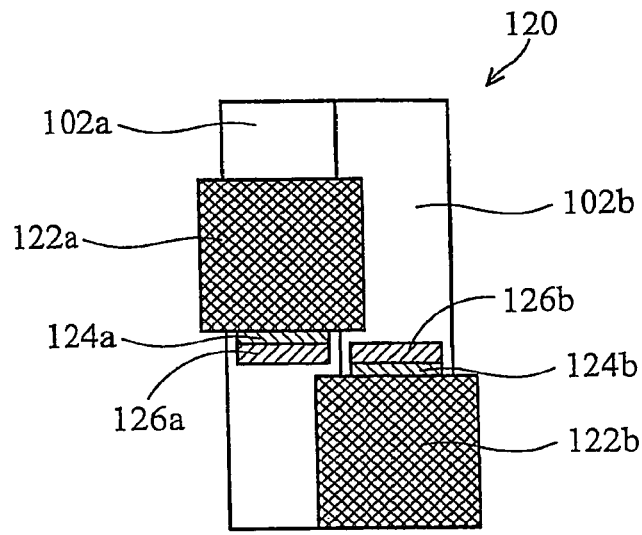
FIG. 3 shows a top view of a portion of another prior art semiconductor device having a CUP bond pad style pattern.
Figure 4:
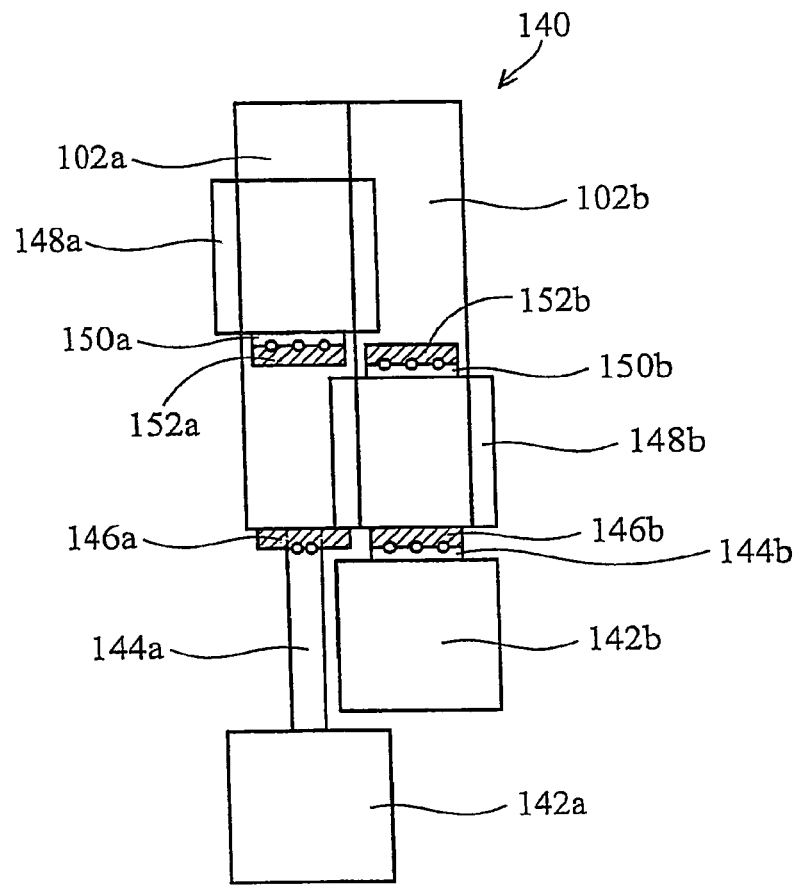
FIG. 4 illustrates a top view of a portion of a semiconductor device manufactured in accordance with an embodiment of the present invention, wherein a first bond pad and a second bond pad are coupled to each input/output cell of the semiconductor device, and wherein the first bond pads have traditional bond pad style pattern and the second bond pads have a CUP bond pad style pattern.
Figure 5:
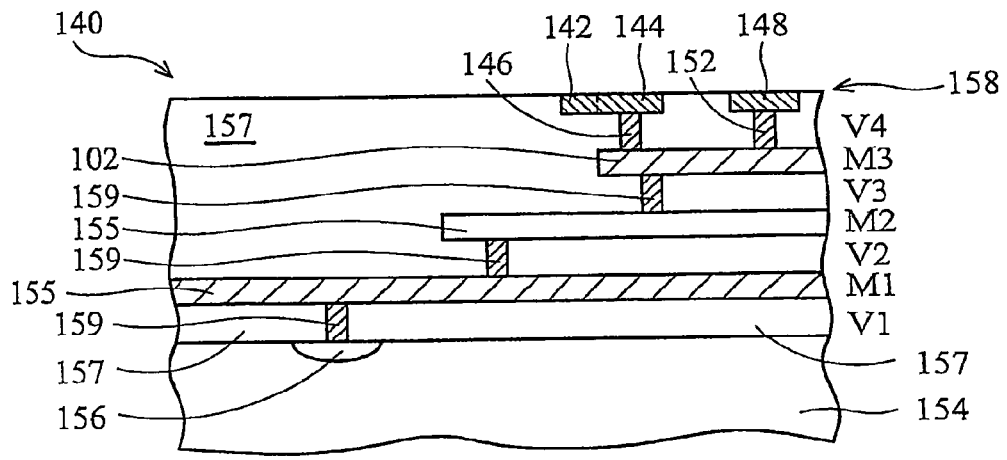
FIG. 5 shows a cross-sectional view of a portion of the semiconductor device shown in FIG. 4.

Referring to FIG. 4, therein is shown a top view of a semiconductor device 140 manufactured in accordance with an embodiment of the present invention, wherein two bond pads 142 and 148 are coupled to each input/output cell 102 of the semiconductor device 140. FIG. 5 shows a cross-sectional view of the semiconductor device 140 shown in FIG. 4. In FIG. 4, an "a" and "b" are used in conjunction with the reference numbers, to depict each of the plurality of input/output cells 102 and corresponding first bond pad 142 and second bond pad 148. However, in the cross-sectional view shown in FIG. 5, the "a" and "b" designation is omitted, and the drawing represents a cross-sectional view of any input/output cell 102 and corresponding bond pads 142 and 148 of the semiconductor device 140.

In the embodiments shown in FIGS. 4 and 5, a first bond pad 142a and a second bond pad 148a are coupled to one input/output cell 102a of the semiconductor device 140. The first bond pad 142a and the second bond pad 148a are preferably simultaneously formed in the same single bond pad layer 158 that is disposed at a top surface of the semiconductor device 140.

The first bond pad 142a may be coupled to the input/output cell 102a using one or more conductive pins 144a and 146a, as shown. The conductive pin 144a may comprise an etch run in the bond pad layer 158 (see FIG. 5) that the first bond pad 142a and the second bond pad 148a are formed in, for example. The conductive pin 146a may comprise a via coupling the contact pin 144a with the underlying input/output cell 102a in a via layer such as layer V4 of the semiconductor device 140, for example (see FIG. 5). The input/output cell 102a may be formed in a metallization layer such as layer M3 of the semiconductor device 140.

Similarly, the second bond pad 148a is electrically coupled to the input/output cell 102a using at least one conductive pin 150a and 152a, wherein conductive pin 150a may reside in the same bond pad layer 158 that the first bond pad 142a and the second bond pad 148a reside in (see FIG. 5), and wherein conductive pin 152a comprises a via coupling vertically the conductive pin 150a to the underlying input/output cell 102a.

Likewise, conductive pins 144b and 146b may be used to couple the first bond pad 142b to other input/output cells such as input/output cell 102b, and conductive pins 150b and 152b may be used to couple the second bond pad 148b to input/output cell 102b.

Conductive pins 150a and 150b are optional and may not be required. For example, the contact pads 148a and 148b may reside directly over and may be electrically coupled to conductive pins 152a and 152b, respectively, which conductive pins 152a and 152b are coupled to input/output cells 102a and 102b. See FIG. 5, wherein conductive pin 152 is coupled between second contact pad 148 and input/output cell 102.

The first bond pads 142a and 142b and the second bond pads 148a and 148b are adapted be bonded to, e.g., using a wire bond, to electrically couple the semiconductor 140 device to a connection external to the semiconductor device 140. Note that the input/output cells 102a/102b may include level shifters, output buffers, input sensing circuits, or other circuitry, (not shown).

A plurality of first bond pads 142a and 142b and second bond pads 148a and 148b are preferably formed in the same manner as described above. Two input/output cells 102a and 102b are shown in FIG. 4; however, there may be many input/output cells 102a, 102b, first bond pads 142a, 142b and second bond pads 148a, 148b formed on the semiconductor device 140 shown.

Preferably, in accordance with embodiments of the present invention, the semiconductor device 140 includes at least two bond pads 142a/142b and 148a/148b electrically coupled to each input/output cell 102a/102b. For example, at least one third bond pad may be coupled to each input/output cell 102a/102b, wherein the third bond pads comprise a different pattern and shape than, or the same pattern and shape as, either the first pattern and second pattern and shape of the first bond pads 142a/142b and second bond pads 148a/148b (not shown in FIGS. 4 and 5; see FIG. 8).

The input/output cells 102a and 102b are preferably electrically coupled to active regions 156 of a semiconductor workpiece 154, and electrical components and connection regions 155 and 159 within and over a semiconductor workpiece 154, as shown in the cross-sectional view of FIG. 5. The workpiece 154 may include a semiconductor substrate comprising silicon or other semiconductor materials covered by an insulating layer (not shown), for example. The workpiece 154 may include active components or circuits 156. The workpiece 154 may comprise silicon oxide over single-crystal silicon, for example. The workpiece 154 may include other conductive layers or other semiconductor elements, e.g. transistors, diodes, etc. Compound semiconductors, GaAs, InP, Si/Ge, or SiC, as examples, may be used in place of silicon.

The connection regions 159 may comprise vias formed in via layers V1, V2, V3, and the connection regions 155 may comprise conductive lines in metallization layers M1 and M2 of a multilevel interconnect structure. The input/output cells 102 may be formed in a metallization layer M3 of the multilevel interconnect structure, as shown. The conductive pins 146 and 152 may be formed in a via level V4 of the multilevel interconnect structure, also shown. A dielectric material 157 comprising $SiO_2$ or other insulators, such as low dielectric constant materials, for example, may be disposed between the conductive regions 155, 159, 102, 146, 152, 142, 144 and 148 to provide electrical isolation and structural support for the semiconductor device 140, for example. The dielectric material 157 may comprise a plurality of layers of dielectric material (not shown).

The first bond pads 142a and 142b preferably comprise a first pattern, and the second bond pads 148a and 148b preferably comprise a second pattern, wherein the first pattern is different from the second pattern. For example, as shown in FIG. 4, the first pattern comprises a traditional staggered bond pad pattern, and the second pattern comprises a CUP pattern. The first pattern may comprise a straight in-line pattern and the second pattern may comprise a staggered pattern, in one embodiment (not shown). In the embodiment shown in FIGS. 4 and 5, the first bond pads 142a and 142b are disposed to the side of the input/output cells 102a and 102b, and the second bond pads 148a and 148b are disposed over the input/output cells 102a and 102b.

Figure 6:
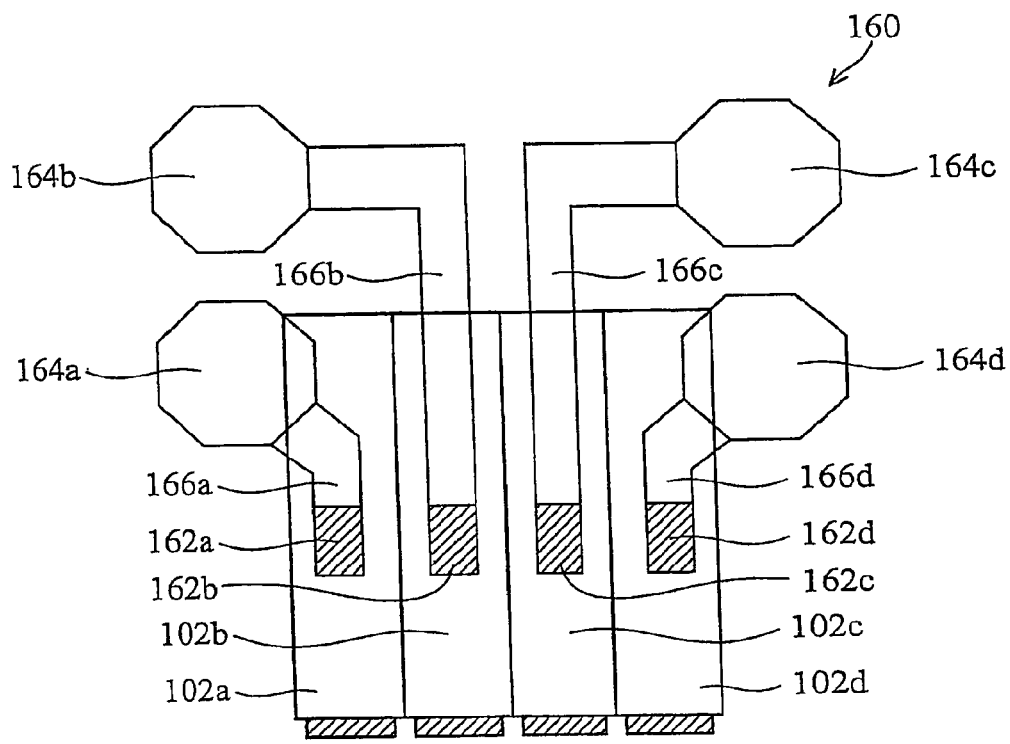
FIG. 6 shows a top view of a semiconductor device manufactured in accordance with another embodiment of the present invention, wherein one bond pad and one ground-up flip chip bump connection location or bond pad are coupled to each input/output cell of the semiconductor device.

FIG. 6 shows a top view of a semiconductor device 160 manufactured in accordance with another embodiment of the present invention, wherein a first bond pad 162a and a second bond pad 164a are coupled to an input/output cell 102a of the semiconductor device 160. Likewise, the semiconductor device 160 includes a first bond pad 162b, 162c, 162d and a second bond pad 164b, 164c, and 164d coupled to each input/output cell 102b, 102c, and 102d, respectively. Conductive pins 166a, 166b, 166c, and 166d may electrically couple the second bond pads 164a, 164b, 164c, and 164d to a respective underlying input/output cell 102a, 102b, 102c, and 102d, as shown.

In the embodiment shown in FIG. 6, the first bond pads 162a, 162b, 162c, and 162d preferably comprise ground-up flip chip bump connection locations, and the second bond pads 164a, 164b, 164c, and 164d comprise another style or pattern layout such as a traditional bond pad pattern, as shown. Thus, in accordance with this embodiment of the present invention, either the first bond pad flip chip bump connection locations 162a, 162b, 162c, and 162d, or the second bond pads 164a, 164b, 164c, and 164d may be used to wire bond to leads of an integrated circuit package, and provide electrical connection from the semiconductor device 160 to the outside world. In one embodiment, both the first bond pads 162a, 162b, 162c, and 162d and the second bond pads 164a, 164b, 164c, and 164d may be used to electrically couple to leads of an integrated circuit package, to provide redundancy and provide a backup connection in the event that one of the connections to the lead of the package becomes severed.

Figure 7:
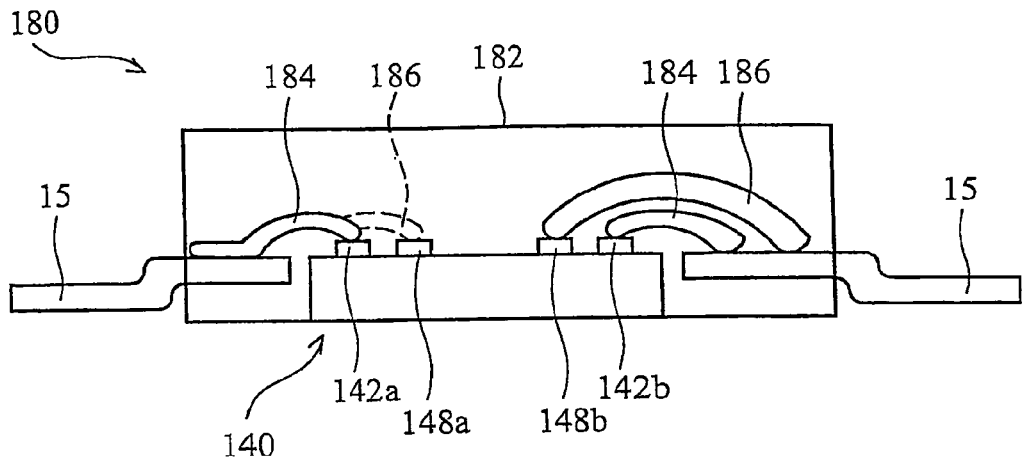
FIG. 7 shows a cross-sectional view of the semiconductor device shown in FIG. 4 implemented in a packaged integrated circuit, wherein the first bond pads, the second bond pads, both the first bond pads and the second bond pads are used to make electrical connection to the leads of the integrated circuit package.

FIG. 7 shows a cross-sectional view of a packaged integrated circuit 180 containing the semiconductor device 140 shown in FIG. 4, wherein the first bond pads 142, the second bond pads 148, or both the first bond pads 142 and the second bond pads 148 are used to connect the semiconductor device 140 to leads 15 of the integrated circuit package 182 in accordance with a preferred embodiment of the present invention. Shown in FIG. 7 is the semiconductor device 140 of FIG. 4 packaged in an integrated circuit package 182, which comprises a plurality of leads 15. Either the first bond pads 142a are coupled to the leads 15 using a wire bond 184, or alternatively, the second bond pads 148a may be coupled to the leads 15 using wire bonds 186, as shown in phantom. In another embodiment, the first bond pads 142b are be coupled to the leads 15 using a wire bond 184, and the second bond pads 148b are also coupled to the leads 15 using a wire bond 186.

In accordance with embodiments of the present invention, the first bond pads 142/162 and/or the second bond pads 148/164 (and third bond pads, if included), are adapted to bond the semiconductor device using wire or flip chip techniques. Alternatively, other bonding techniques such as tape automated, direct copper, ball-ball, ball-wedge, or wedge-wedge bonding techniques, as examples, may be used to electrically couple the first bond pads 142/162 and/or the second bond pads 148/164 to leads 15 of an integrated circuit package 182 such as the one shown in FIG. 7.

The integrated circuit package 182 shown in FIG. 7 is shown as a dual-in-line (DIP) package; however, embodiments of the present invention have application in virtually any type of integrated circuit package, including packages adapted to contain more than one integrated circuit 140 or 160, for example.

Figure 8:
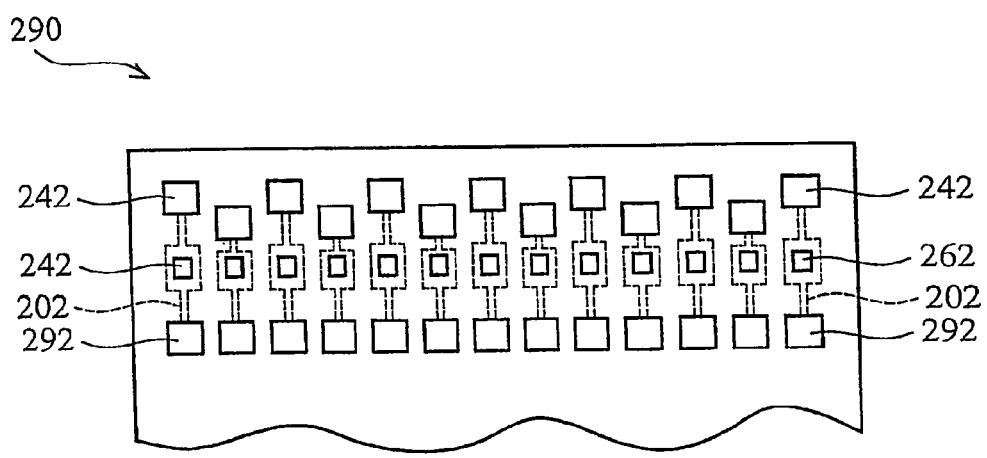
FIG. 8 shows a top view of a semiconductor device in accordance with an embodiment of the present invention having a first bond pad, a second bond pad, and a third bond pad coupled to each input/output cell of the semiconductor device.

FIG. 8 shows a top view of a semiconductor device or integrated circuit die 290 in accordance with an embodiment of the present invention having a first bond pad 242, a second bond pad 262, and a third bond pad 292 coupled to each input/output cell 202 of the semiconductor device 290. Embodiments of the invention include coupling two or more bond pads such as bond pads 242, 262 and 292 to each input/output cell 202 of a semiconductor device 290. Each set of bond pads 242, 262 and 292 may comprise a different pattern, although similar patterns may be used for each bond pad 242, 262 and 292 set. One or more sets of bond pads 242, 262 and 292 may be used to couple the semiconductor device 290 to leads of a package, as shown and described with reference to FIG. 7.

While the bond pad patterns shown in the figures and described herein comprise traditional bond pad pattern, CUP, and ground-up flip chip bump patterns, the first bond pad 142/162 pattern and the second bond pad 148/164 pattern may alternatively comprise other patterns, such as staggered, in-line, or area array bumps, as examples.

Embodiments of the present invention include an semiconductor device and/or an integrated circuit die 140, 160, 290 having at least two sets of bond pads 142, 148, 162, 164, 242, 262, 292 coupled to each input/output cell 102, 202. Embodiments of the present invention also include methods of manufacturing the semiconductor device and integrated circuit die 140, 160, 290 described herein. Embodiments of the invention further include packaged integrated circuits 180 including the integrated circuit die and semiconductor devices 140, 160, 290 described herein, wherein each lead of the packaged integrated circuit 180 is coupled to a first bond pad, at least one second bond pad, or both, (142, 148, 162, 164, 242, 262, 292) of the integrated circuit die 140, 160, 290 having a plurality of bond pads 142, 148, 162, 164, 242, 262, 292 for each input/output cell 102, 202 as described herein. Embodiments of the present invention also include methods of packaging the integrated circuit die 140, 160, 290 described herein.

Advantages of embodiments of the present invention include giving a circuit designer a choice between two or more bond pad 142, 148, 162, 164, 242, 262, 292 patterns for packaging an integrated circuit or making electrical connection to each input/output cell 102, 202 of a semiconductor device. Both the first bond pad 142, 162, 262 and the at least one second bond pad 148, 164, 264, 292 may be used for electrical connection to input/output cells 102, 202 providing redundancy in the semiconductor device and improving reliability in packaging. For example, if a connection to the first bond pad 142, 162 or 262 is broken or becomes disconnected, the semiconductor device 140, 160, or 290 will still continue to operate because it remains electrically connected to the at least one second bond pad 148, 164, 264 or 292. Embodiments of the present invention are useful for integrated circuit die packaged singly or in a multi-chip package, e.g., in a multi-die package wherein wiring is required between various layers or other arrangements of a plurality of semiconductor die.

A further advantage of preferred embodiments of the present invention is providing reducing costs to the semiconductor device manufacturer, by reducing the number of styles of bond pad pattern designs in their integrated circuit packaging portfolio. The number of lithography masks required by semiconductor device manufacturer is reduced in accordance with embodiments of the present invention.

Advantageously, no additional lithography masks or material layers are required in the semiconductor device 140, 160 and 290 described herein. The first bond pads 142, 162, 262 and the at least one second bond pads 148, 164, 264, 292 are preferably formed within a single layer 158 of the semiconductor device.

Further advantages include providing easier routing of the connections between the input/output cells and the bond pads, and the ability to manufacture a symmetric bond pad structure. Routing resources are conserved, because the top two or more metallization layers are reserved for bond pad placement and connections thereto. Thus, the top two or more metallization levels (e.g., layer 158 and V4 of FIG. 5) can serve as routing channels when a double I/O ring (e.g., the two sets of bond pads such as 142 and 148 in FIG. 4) is utilized in accordance with embodiments of the present invention. Furthermore, electrical signals are not degraded due to the pad type, in accordance with embodiments of the present invention.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    providing a workpiece;
    forming active areas over or within the workpiece;
    forming a plurality of input/output cells over at least one active area; and
    coupling a first bond pad and at least one second bond pad to each input/output cell;
    wherein coupling the first bond pad comprises forming the first bond pad in a first pattern, wherein coupling the at least one second bond pad comprises forming the second bond pad in at least one second pattern, the at least one second pattern being different from the first pattern, wherein forming each first bond pad comprises disposing a center of the first bond pad over an input/output cell to which the first bond pad is coupled, and wherein forming each at least one second bond pad comprises disposing the at least one second bond pad near a side of and spaced apart from a respective one of the plurality of input/output cells.

2. The method according to claim 1, wherein coupling the first bond pad and the at least one second bond pad comprise simultaneously forming each first bond pad and each at least one second bond pad.

3. The method according to claim 1, wherein the first pattern comprises a straight in-line pattern, and wherein one of the at least one second patterns comprises a staggered pattern.

4. The method according to claim 1, wherein the first pattern and the at least one second pattern comprise a traditional bond pad pattern, a contact-under-pad (CUP) pattern, a ground-up flip chip bump pattern, a staggered pattern, an in-line pattern, or an area array bump pattern.

5. The method according to claim 1, further comprising forming at least one conductive pin disposed between and electrically coupling each first bond pad and each at least one second bond pad to the input/output cell.

6. The method according to claim 1, wherein forming the plurality of input/output cells comprises forming at least one of the input/output cells including level shifters, output buffers, input sensing circuits, or other circuitry.

7. A method of fabricating an integrated circuit die comprising:
    forming a plurality of input/output cells in a substrate;
    forming a plurality of first bond pads disposed over the input/output cells in a first pattern, wherein each first bond pad is electrically coupled to one of the underlying input/output cells over which each respective first bond pad is primarily disposed; and
    forming a plurality of second bond pads disposed proximate the input/output cells in a second pattern, each second bond pad being spaced apart from and disposed near a side of an input/output cell, each second bond pad being electrically coupled to a first input/output cell of the plurality of input/output cells, wherein the second pattern is different from the first pattern.

8. The method according to claim 7, wherein each first bond pad and each second bond pad are adapted to couple the integrated circuit die to a connection external to the integrated circuit die.

9. The method according to claim 7, wherein the first pattern comprises a straight in-line pattern, and wherein the second pattern comprises a staggered pattern.

10. The method according to claim 7, further comprising at least one conductive pin disposed between and electrically coupling each first bond pad and each second bond pad to the first input/output cell.

11. The method according to claim 10, wherein the first bond pads and the second bond pads are formed in a bond pad layer disposed over the input/output cells, wherein the at least one conductive pin comprises a conductive line formed in the bond pad layer.

12. The method according to claim 7, further comprising packaging the integrated circuit die.

13. The method according to claim 12, wherein the packaged integrated circuit die includes a plurality of leads, each lead being coupled to a first bond pad or a second bond pad of the integrated circuit die.

14. The method according to claim 7, further comprising forming a plurality of third bond pads disposed proximate the input/output cells, wherein each third bond pad is electrically coupled to one of the underlying input/output cells.

15. The method according to claim 7, wherein the first bond pads or the second bond pads are adapted to bond to a semiconductor device using wire, flip chip, tape automated, direct copper ball-ball, ball-wedge, or wedge-wedge bonding techniques.

* * * * *